(12) United States Patent
Nakahori et al.

(10) Patent No.: US 6,190,951 B1
(45) Date of Patent: Feb. 20, 2001

(54) METHOD FOR MANUFACTURING A LIQUID CRYSTAL DISPLAY APPARATUS

(75) Inventors: Tadaki Nakahori; Masakuni Fujiwara; Harumi Yasuda, all of Kikuchi-gun (JP)

(73) Assignee: Advanced Display Inc., Kikuchi-gun (JP)

( * ) Notice: Under 35 U.S.C. 154(b), the term of this patent shall be extended for 0 days.

(21) Appl. No.: 09/346,725

(22) Filed: Jul. 2, 1999

(30) Foreign Application Priority Data

Jul. 6, 1998 (JP) .................................................. 10-190121

(51) Int. Cl.$^7$ ...................................................... H01L 22/00
(52) U.S. Cl. ........................ 438/151; 438/151; 438/152; 438/153; 257/292; 257/293
(58) Field of Search ..................................... 438/151, 152, 438/153; 257/292, 293, 294, 295, 435, 436, 443; 349/137, 110, 38, 111; 459/88

(56) References Cited

U.S. PATENT DOCUMENTS

| | | | |
|---|---|---|---|
| 5,187,604 | * 2/1993 | Taniguchi et al. | 359/88 |
| 5,202,575 | * 4/1993 | Sakai | 257/292 |
| 5,216,491 | * 6/1993 | Yamamoto et al. | 257/53 |
| 5,360,744 | * 11/1994 | Shimuzu | 437/2 |
| 5,510,918 | * 4/1996 | Matsunaga et al. | 359/88 |
| 5,724,107 | * 3/1998 | Nishikawa et al. | 349/38 |
| 5,905,553 | * 3/1999 | Matsukawa et al. | 349/110 |

* cited by examiner

*Primary Examiner*—Charles Bowers
*Assistant Examiner*—Laura M Schillinger
(74) *Attorney, Agent, or Firm*—Oblon, Spivak, McClelland, Maier & Neustadt, P.C.

(57) ABSTRACT

The present invention is directed to method for manufacturing a liquid crystal display apparatus in which a thin film transistor formed by successively depositing on a glass substrate a gate electrode, a gate insulating film, an active layer made of amorphous silicon, a source electrode and a drain electrode is used for driving liquid crystal. The method includes steps of: forming the gate electrode by patterning a gate metal layer coating the glass substrate by a wet etching process using an etchant containing cerium ammonium nitrate; removing an etching reaction product adhering on the substrate by washing it with a hydrofluoric acid solution; and forming the gate insulating film.

5 Claims, 3 Drawing Sheets

METHOD FOR MANUFACTURING A LIQUID CRYSTAL DISPLAY APPARATUS

BACKGROUND OF THE INVENTION

The present invention relates to a manufacturing method for an active-matrix liquid crystal display apparatus (hereinafter, referred to as "TFT-LCD") wherein a TFT (thin film transistor) is used as a switching element. More specifically, the present invention concerns a method for manufacturing a TFT array substrate which is less susceptible to point defects and line defects, and its objective is to improve the display characteristics and productivity of a TFT-LCD.

A TFT-LCD in which an active-matrix substrate, a color filter substrate also serving as an opposing electrode and liquid crystal are assembled on a glass substrate has been put into the market as a flat display that meets demands for a flat image-display apparatuses, and has been expected to develop a big market as a display for notebook personal computers as well as for office automation monitors.

In a TFT, in most cases, amorphous silicon which can be deposited on a large area at comparatively low temperatures is used as a semiconductor layer.

For example, FIG. 4 shows a cross-sectional view of an essential portion of a TFT array substrate obtained by a conventional manufacturing method.

A first conductive thin film is formed on a glass substrate 51. Next, the first conductive thin film is patterned in a first photolithography process so that a gate electrode 52 and an auxiliary capacitive electrode are formed. Then, a gate insulating film 53, an a-Si:H (amorphous silicon to which hydrogen atoms are added) semiconductor layer 54, an n+a-Si:H ohmic contact layer 55 are deposited by the plasma CVD method.

Next, the semiconductor layer and the ohmic contact layer are patterned in a second photolithography process so that portions to form channels are left. Then, a second conductive thin film is formed. Moreover, the second conductive thin film is patterned in a third photolithography process so that a pixel electrode 56 is formed. Next, contact holes used for forming terminal sections are patterned in a fourth photolithography process. Then, a third conductive thin film such as an Al—Si alloy is formed. Next, the third conductive thin film is patterned in a fifth photolithography process so that a source electrode 57 and a drain electrode 58 are formed, and using the source electrode 57 and the drain electrode 58 as masks, the ohmic contact layer 55 is patterned so as to form a thin film transistor.

Then, a passivation film 59 is formed by a method such as the plasma CVD method, and contact holes used to connect TCPs are patterned in a sixth photolithography process, thereby completing the formation of a thin film transistor array substrate.

Upon forming the gate electrode 52 and the auxiliary capacitive electrode during the process for manufacturing the TFT, a material such as Cr, which has high chemical resistance and a high fusing point, is often used as the material for the gate electrode 52. In order to pattern Cr, a wet etching process is carried out by using an etchant containing cerium ammonium nitrate.

After the gate electrode 52 has been patterned, a gate insulating film 53 is formed, or a gate insulating film 53, an a-Si:H (amorphous silicon to which hydrogen atoms are added) semiconductor layer 54, and an n+a-Si:H ohmic contact layer 55 are continuously formed by the plasma CVD method, and the semiconductor layer 54 and the ohmic contact layer 55 are shaped into an island pattern. Then, a pixel electrode 56 is formed, and after contact holes used for forming contact sections have been formed, a conductive thin film, such as an Al—Si film, is formed so as to form a source electrode 57 and a drain electrode 58. At this time, since the adhesive strength between the glass substrate 51 and the gate insulating film 53 is weak, peeling off of the film tends to occur and cause disconnection of the source wiring, etc., during post processes, resulting in degradation in the display.

Here, Japanese Unexamined Patent Publication No. 203982/1993 discloses a method in which, in order to form a thin film transistor having high reliability, after washing a glass substrate by a hydrofluoric acid solution, an insulating film is formed thereon; however, in order to prevent film rising due to the insufficient adhesive strength, after washing a glass substrate by a hydrofluoric acid solution in the same manner, a gate electrode is formed, and in the case when, after formation of the gate electrode, a gate insulating film is formed without carrying out washing by a hydrofluoric solution, it is not possible to solve the above-mentioned problem.

Moreover, Japanese Unexamined Patent Publication No. 217919/1989 discloses a method in which the adhesive strength between the glass substrate and the gate insulating film is increased in the case when, after a gate electrode has been patterned by dry etching using fluorine-type gas, a gate insulating film is formed; however, the problem with this method is that, in the case of a high concentration of the hydrofluoric acid, or in the case of a long processing time, the surface of the glass substrate becomes so rough that the adhesive strength is lowered conversely.

SUMMARY OF THE INVENTION

The objective of the present invention is to provide a manufacturing method for improved TFTs which can solve the above-mentioned problem and which, when used as a driving element for a liquid crystal display, can minimize defects in the liquid crystal display and produce the liquid crystal display with high yield.

In order to achieve the above-mentioned objective, the method for manufacturing a liquid crystal display apparatus of the present invention, which is a manufacturing method of a liquid crystal display apparatus in which a thin film transistor formed by successively depositing on (1) a glass substrate a gate electrode (2), a gate insulating film (3) an active layer made of amorphous silicon, a source electrode and a drain electrode is used for driving liquid crystal, said method comprising steps of: forming the gate electrode (2) by patterning a gate metal layer coating the glass substrate (1) by a wet etching process using an etchant containing cerium ammonium nitrate; removing an etching reaction product adhering on the substrate (1) by washing it with a hydrofluoric acid solution; and forming the gate insulating film (3).

In other words, in the manufacturing method of TFTs of the present invention, after the gate electrode (2) has been patterned, prior to formation of the gate insulating film (3), at least either a buffered hydrofluoric acid process or a dilute hydrofluoric acid process is carried out so that a residual product on the glass substrate (1) and the gate electrode (2) is removed and so that the glass substrate 1 is slightly roughened; thus, the adhesive strength between the glass substrate 1 and the gate insulating film (3) is increased so that a thin-film transistor array substrate free from defects due to peeling off of the film can be produced with high yield.

DETAILED DESCRIPTION

EMBODIMENT 1

Figure 1:
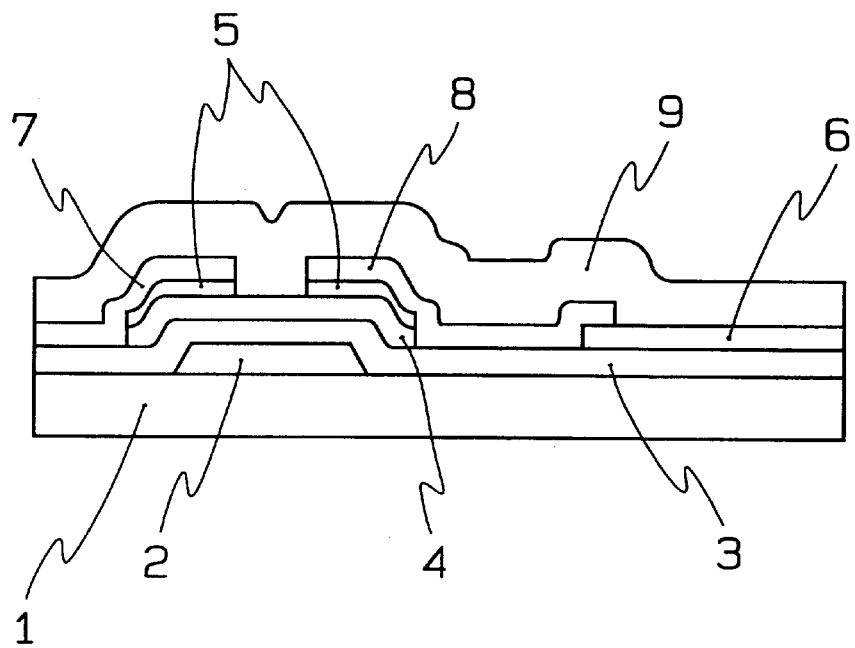
FIG. 1 is a cross-sectional view showing an essential part of a TFT array substrate obtained by the manufacturing method of the present invention.
Figure 2:
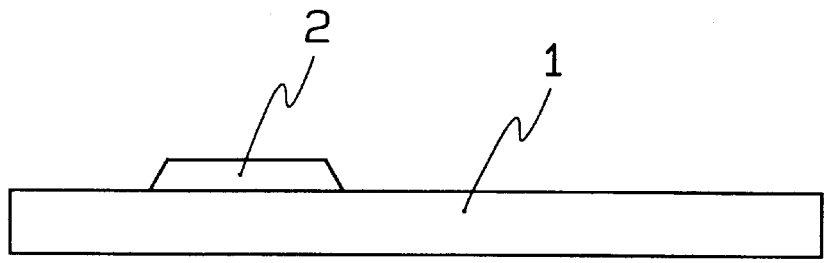
FIG. 2 is a cross-sectional view showing a structure before subjecting to a process using a buffered hydrofluoric acid solution.
Figure 3:
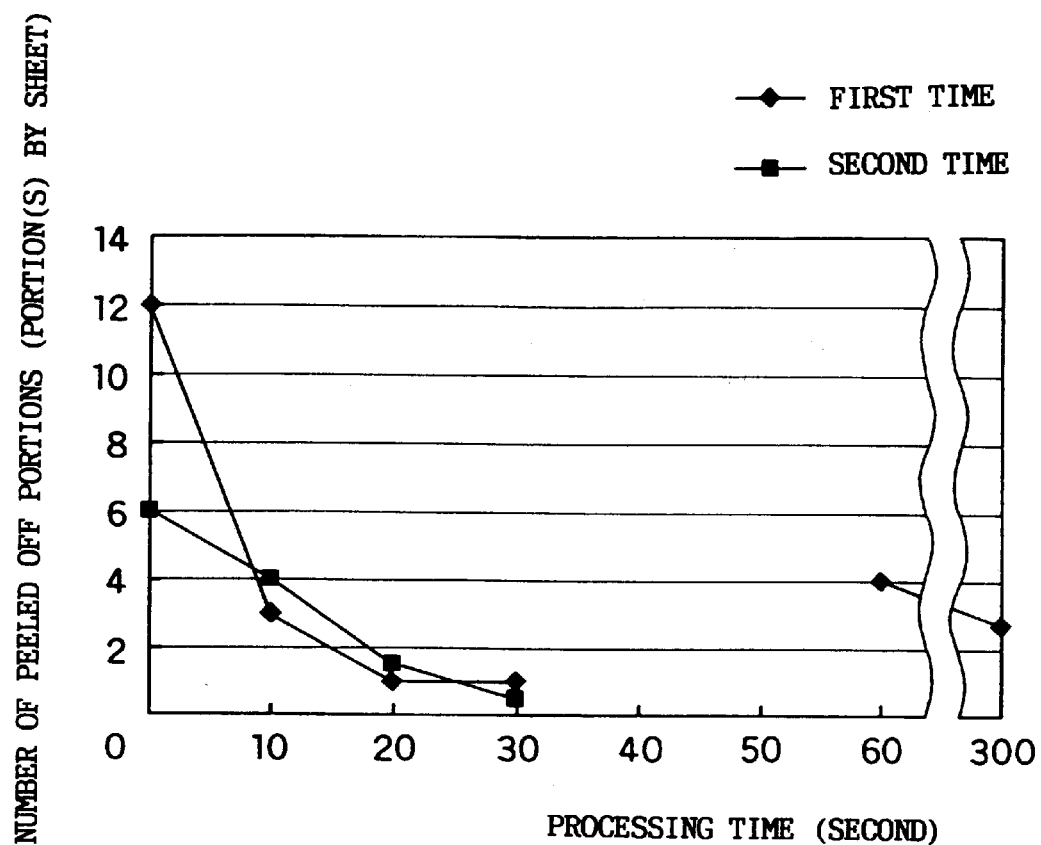
FIG. 3 is an explanatory view showing the relationship between the washing time by the use of the hydrofluoric acid solution and the occurrence of film rising.
Figure 4:
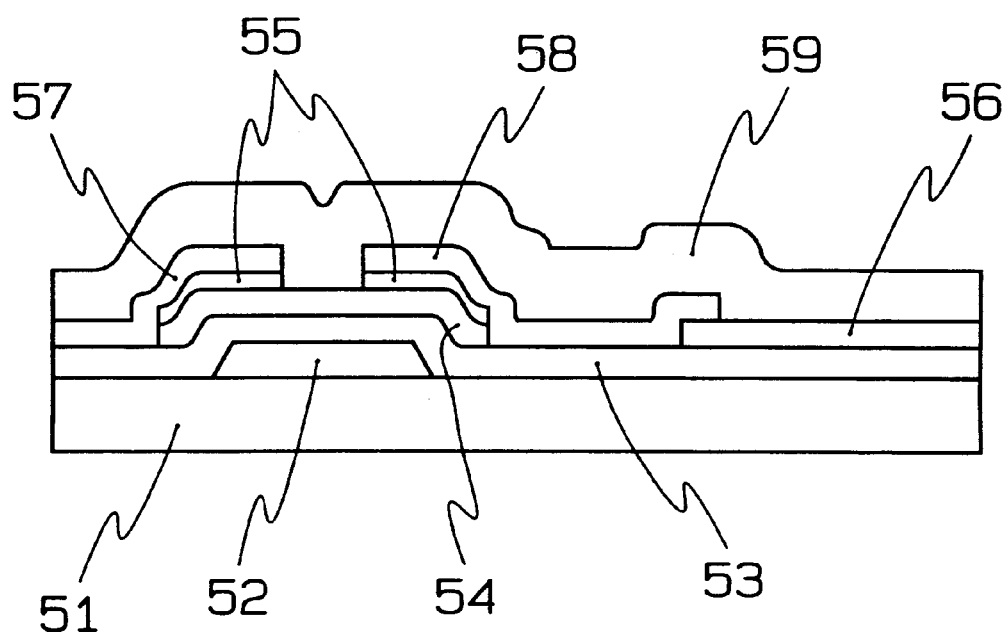
FIG. 4 is a cross-sectional view showing an essential portion of a TFT array substrate obtained by a conventional manufacturing method.

Referring to Figures, the following description will discuss embodiments of the present invention in detail. FIG. 1 is a cross-sectional view showing an essential part of a TFT array substrate obtained by the manufacturing method of the present invention, and FIG. 2 is a drawing that shows a cross-section of a structure after formation of a gate electrode 2 and an auxiliary capacitive electrode during a process for forming a thin film transistor. Thereafter, prior to formation of a gate insulating film 3, this is subjected to a process using a buffered hydrofluoric acid solution having a lean hydrofluoric acid concentration of 0.5 to 1% or a dilute hydrofluoric acid solution having a lean hydrofluoric acid concentration of 0.1 to 0.3% for 30 seconds. FIG. 3 shows the relationship between the washing time by the use of the hydrofluoric acid solution and the occurrence of film rising. This shows that it is possible to prevent the film from rising by optimizing the processing time. After the washing process by the use of the hydrofluoric acid solution, washing is carried out prior to film formation, and the gate insulating film 3 is formed, or the gate insulating film 3, an a-Si:H (amorphous silicon to which hydrogen atoms are added) semiconductor layer 4 and an n+a-Si:H ohmic contact layer 5 are continuously formed.

The insulating film 3 may be provided as a one-layer film or a multi-layer film; however, it is preferably set to have a total film thickness of approximately 300 nm to 500 nm from the viewpoint of the transistor characteristics and wiring capacity. The semiconductor layer 4 and the ohmic contact layer 5 are respectively designed to have a thicknesses of 100 nm to 300 nm and 20 nm to 50 nm.

Next, the semiconductor layer 4 and the ohmic contact layer 5 are shaped into an island pattern, an pixel electrode 6 is formed, and contact holes for forming terminal sections are formed. Then, a conductive thin film, such as an Al—Si alloy film, is formed so as to form a source electrode 7 and a drain electrode 8. In this case, since the adhesive strength between the glass substrate 1 and the gate insulating film 3 is strong, no problem, such as film rising, occurs.

Thereafter, a TFT array substrate is manufactured by using the same method as the conventional method.

EMBODIMENT 2

Referring to Figures, the following description will discuss another embodiment of the present invention in detail. FIG. 2 is a drawing that shows a cross-section of a structure after formation of a gate electrode 2 and an auxiliary capacitive electrode during a process for forming a thin film transistor. Thereafter, prior to formation of a gate insulating film 3, this is subjected to a process included in a washing operation prior to film formation, in which a buffered hydrofluoric acid solution having a lean hydrofluoric acid concentration of 0.5 to 1% or a dilute hydrofluoric acid solution having a lean hydrofluoric acid concentration of 0.1 to 0.3% is applied for 30 seconds. Thereafter, the gate insulating film 3 is formed, or the gate insulating film 3, an a-Si:H (amorphous silicon to which hydrogen atoms are added) semiconductor layer 4 and an n+a-Si:H ohmic contact layer 5 are continuously formed.

The insulating film 3 may be provided as a one-layer film or a multi-layer film; however, it is preferably set to have a total film thickness of approximately 300 nm to 500 nm from the viewpoint of the transistor characteristics and wiring capacity. The semiconductor layer 4 and the ohmic contact layer 5 are respectively designed to have a thicknesses of 100 nm to 300 nm and 20 nm to 50 nm.

Next, the semiconductor layer 4 and the ohmic contact layer 5 are shaped into an island pattern, an pixel electrode 6 is formed, and contact holes for forming terminal sections are formed. Then, a conductive thin film, such as an Al—Si alloy film, is formed so as to form a source electrode 7 and a drain electrode 8. In this case, since the adhesive strength between the glass substrate 1 and the gate insulating film 3 is strong, no problem, such as film rising, occurs.

Thereafter, a TFT array substrate is manufactured by using the same method as the conventional method.

As described above, the inventions as disclosed in claims 1, 2 and 3 make it possible to increase the adhesive strength between the glass substrate 1 and the gate insulating film 3, to prevent defects such as disconnection of source wiring, etc. due to film rising of the gate insulating film, and to provide a liquid crystal display apparatus free from defects with high yield.

What is claimed is:

1. Method for manufacturing a liquid crystal display apparatus in which a thin film transistor formed by successively depositing on a glass substrate a gate electrode, a gate insulating film, an active layer made of amorphous silicon, a source electrode and a drain electrode is used for driving liquid crystal, said method comprising steps of:

forming the gate electrode by patterning a gate metal layer coating the glass substrate by a wet etching process using an etchant containing cerium ammonium nitrate;

removing an etching reaction product adhering on the substrate by washing it with a hydrofluoric acid solution; and forming the gate insulating film.

2. The method of claim 1, wherein the hydrofluoric acid solution is a buffered hydrofluoric acid solution having a concentration of 0.5 to 1%, or a dilute hydrofluoric acid solution having a concentration of 0.1 to 0.3%.

3. The method of claim 2, wherein the wet etching process using buffered hydrofluoric acid solution or dilute hydrofluoric solution is subjected for 20 to 30 seconds.

4. The method of claim 1, wherein said insulating film is a single or multi layered film.

5. The method of claim 1, wherein said insulating film is 300 to 500 nm thick.

* * * * *